United States Patent [19]
Yamagiwa

[11] 4,329,597
[45] May 11, 1982

[54] LOGIC CIRCUIT

[75] Inventor: Akira Yamagiwa, Kanagawa, Japan

[73] Assignee: Hitachi, Ltd., Tokyo, Japan

[21] Appl. No.: 81,894

[22] Filed: Oct. 4, 1979

[30] Foreign Application Priority Data

Oct. 17, 1978 [JP] Japan .................. 53-127527

[51] Int. Cl.³ .................. H03K 19/12; H01L 31/00
[52] U.S. Cl. .................. 307/455; 307/310
[58] Field of Search .................. 307/310, 203

[56] References Cited

U.S. PATENT DOCUMENTS

| | | | |
|---|---|---|---|
| 3,329,836 | 7/1967 | Pearlman et al. | 307/310 |
| 3,590,274 | 6/1971 | Marley | 307/310 |
| 3,622,799 | 11/1971 | Marley | 307/310 |

OTHER PUBLICATIONS

"Fully Compensated Emitter Coupled Logic", by Muller et al., 1973, IEEE, Int. Solid State Circuits Conferences, pp. 168, 169.

Primary Examiner—Harold A. Dixon
Attorney, Agent, or Firm—Craig and Antonelli

[57] ABSTRACT

In a logic circuit comprising a low-amplitude CML circuit including a transistor functioning as a constant-current source, the constant-current source transistor is biased by a bias power source which is capable of compensating for both the power supply voltage dependency and the junction temperature dependency of the CML circuit. In the logic circuit, negative feedback is applied to the constant-current source transistor through its base bias circuit to compensate for the dependency of the constant-current source transistor on the power supply voltage, and the difference between the junction temperature dependency of the junction voltage of one of two transistors in the control circuit and that of the other transistor due to the different emitter current densities is utilized to compensate for the dependency of the constant current source transistor on the junction temperature.

16 Claims, 9 Drawing Figures

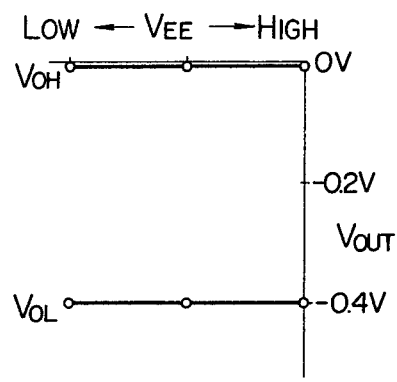
FIG. 4
PRIOR ART
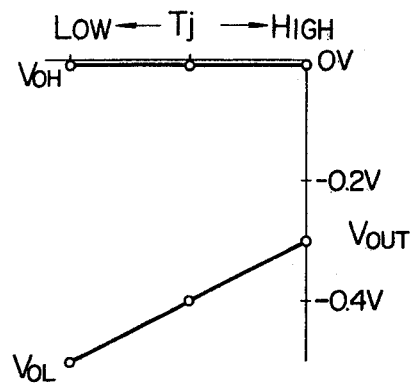
FIG. 5
PRIOR ART
FIG. 6
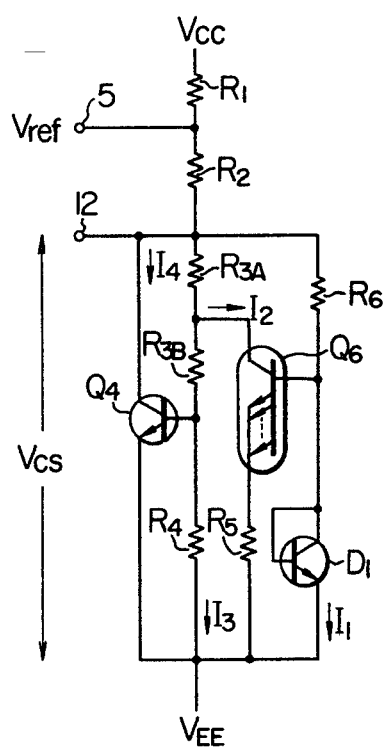

LOGIC CIRCUIT

BACKGROUND OF THE INVENTION

The present invention relates to a logic circuit which is commonly called a CML (Current Mode Logic) circuit.

A CML circuit comprising bipolar transistors as its basic components is known as being one of the highest speed devices available at the present time. An ECL (Emitter Coupled Logic) circuit comprising emitter follower transistors as its basic components and operating with a logical amplitude of 0.8 V has heretofore been known to be one of logic circuits operable at a high speed. The remarkable progress in the semiconductor integrated circuit technique in recent years has led to the realization of circuit integration at a higher packaging density and has been successful in reducing noise to a level far lower than that of conventional logic circuits of this kind. Thus, it is now possible to provide a low-amplitude logic circuit in which the logical amplitude is reduced to about 0.4 V from the previous value of 0.8 V. The low amplitude eliminates the problem of transistor saturation, and the emitter follower transistors are now unnecessary. However, difficulties have arisen in such CML circuits in compensating for power supply variations and junction temperature dependency. These problems have heretofore hampered the utilization of such CML circuits.

SUMMARY OF THE INVENTION

It is therefore a primary object of the present invention to provide a novel and improved logic circuit comprising a CML circuit, in which its power source circuit is capable of compensating for both the temperature dependency and the power supply voltage dependency of the CML circuit.

The logic circuit according to the present invention comprises a CML circuit including at least an input terminal to which an input signal is applied, an output terminal at which an output signal appears, and a transistor functioning as a constant-current source, and a bias circuit connected to the base of the transistor functioning as the constant-current source. The bias circuit comprises a shunt regulation circuit generating a base bias voltage which is maintained at a constant level regardless of a variation in the power supply voltage $V_{EE}$, and a control circuit controlling the shunt regulation circuit depending on a variation in the junction temperature thereby varying correspondingly the base bias voltage applied from the shunt regulation circuit. This insures that the current flowing through the constant-current source transistor is kept at a constant value. The shunt regulation circuit compensates for the variation in the power supply voltage $V_{EE}$, and the control circuit compensates for the junction temperature dependency of the constant-current source transistor.

BRIEF DESCRIPTION OF THE DRAWINGS

FIGS. 3, 4 and 5 show the transmission characteristic, the power supply voltage dependency characteristic and the temperature dependency characteristic respectively of the CML circuit shown in FIG. 1 when the power source circuit of prior art structure shown in FIG. 2 is employed.

FIG. 6 is a circuit diagram of a preferred form of the improved bias generating circuit according to the present invention.

DETAILED DESCRIPTION

Figure 1:
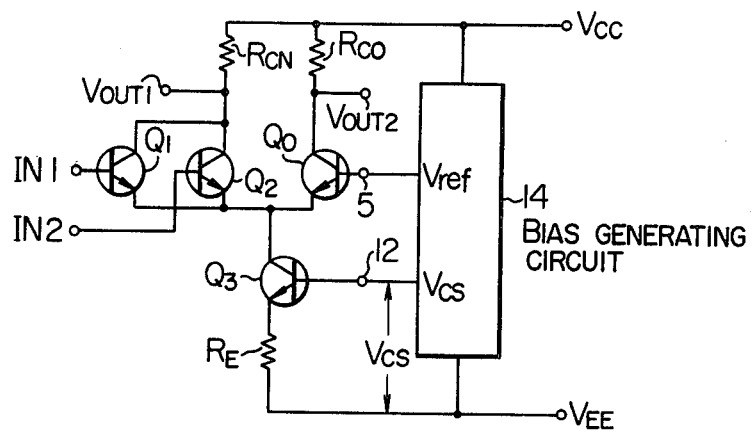
FIG. 1 is a circuit diagram of a low-amplitude CML circuit of the direct coupled type.

Referring to FIG. 1 showing the structure of such a CML circuit, transistors $Q_0$, $Q_1$ and $Q_2$ are basic circuit elements of the CML circuit and are common-connected at their emitters to the collector of another transistor $Q_3$ which constitutes a constant-current source circuit together with its emitter resistor $R_E$. The collectors of the transistors $Q_1$ and $Q_2$ are connected through a common resistor $R_{CN}$ to a constant-potential source of voltage $V_{CC}$, while the collector of the transistor $Q_0$ is connected through another resistor $R_{CO}$ to the constant-potential source of voltage $V_{CC}$. The emitter of the transistor $Q_3$ is connected through the resistor $R_E$ to another constant-potential source of voltage $V_{EE}$, and its base is connected to a bias generating circuit 14 to be maintained at voltage $V_{CS}$ higher than voltage $V_{EE}$. The bias generating circuit 14 applies a reference voltage $V_{ref}$ to the base of the transistor $Q_0$.

This CML circuit operates in a manner well known in the art. The operation of this CML circuit will be described briefly. When one of input signals $IN_1$ and $IN_2$ applied to the bases of the transistors $Q_1$ and $Q_2$ respectively exceeds the level of the reference voltage $V_{ref}$ applied from the power source circuit 14 to the base of the transistor $Q_0$, current is switched from the transistor $Q_0$ to the transistor $Q_1$ or $Q_2$. Consequently, an output signal $V_{OUT1}$ representing the NOR logic of the two input signals $IN_1$ and $IN_2$ appears at the common-connected collectors of the transistors $Q_1$ and $Q_2$, while an output signal $V_{OUT2}$ representing the OR logic of the two input signals $IN_1$ and $IN_2$ appears at the collector of the transistor $Q_0$. In such a low-amplitude CML circuit, compensation for the power supply voltages $V_{EE}$ and $V_{CC}$ as well as compensation for the junction temperature is required in order to ensure the desired noise margin. The important factors for satisfying this requirement include the operation of the constant-current source circuit composed of the transistor $Q_3$ and its emitter resistor $R_E$ and the operation of the bias generating circuit 14 applying the current source voltage $V_{CS}$ to the transistor $Q_3$. The basic idea of compensating for a variation in the power supply voltages and a variation in the junction temperature in the CML circuit shown in FIG. 1 is to prevent any variation in the potential level of each of the output signals $V_{OUT1}$ and $V_{OUT2}$ regardless of variations in the power supply voltages and junction temperature. To this end, the current source voltage $V_{CS}$ applied from the bias generating circuit 14 to the base of the transistor $Q_3$ must be such that the current supplied to the transistor $Q_3$ may not be subjected to a variation due to a variation in the power supply voltage $V_{EE}$ and a variation in the junction temperature.

Figure 2:
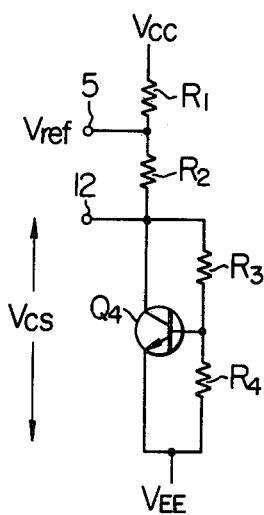
FIG. 2 is a circuit diagram of the prior art bias generating circuit which has been used in the past in the circuit shown in FIG. 1.

FIG. 2 shows a prior art form of the bias generating circuit 14. The circuit shown in FIG. 2 is commonly known as a shunt regulation circuit, in which a resistor $R_3$ is connected across the collector and the base of a transistor $Q_4$, and another resistor $R_4$ is connected across the base and the emitter of the transistor $Q_4$ to constitute a negative feedback circuit or a base bias circuit for the transistor $Q_4$. The current flowing through this negative feedback circuit is limited by two resistors $R_1$ and $R_2$ connected in series. The current source voltage $V_{CS}$ appearing across the collector and the emitter of the transistor $Q_4$ is given by the following equation (1):

$$V_{CS} = (R_3 + R_4)/R_4 \cdot V_{BE4} \tag{1}$$

where $V_{BE4}$ is the emitter-base voltage of the transistor $Q_4$. In the equation (1), the base current of the transistor $Q_4$ is disregarded.

When this current source voltage $V_{CS}$ is applied across the base of the transistor $Q_3$ and the resistor $R_E$ connected to the emitter of the transistor $Q_3$ in FIG. 1, the collector current of the transistor $Q_3$, that is, the current switch current $I_{CS}$ is given by the following equation (2):

$$I_{CS} = (V_{CS} - V_{BE3})/R_E \tag{2}$$

where $V_{BE3}$ is the base-emitter voltage of the transistor $Q_3$. It is supposed herein that $V_{BE3} = V_{BE4} = V_{BE}$, and the value of $V_{CS}$ given by the equation (1) is introduced into the equation (2). The rate of variation of the current switch current $I_{CS}$ relative to the variation of the power supply voltage $V_{EE}$, and the rate of variation of the current switch current $I_{CS}$ relative to the variation of the junction temperature $T_j$ are given by the following equations (3) and (4) respectively:

$$(\Delta I_{CS}/\Delta V_{EE}) = 0 \tag{3}$$

$$(\Delta I_{CS}/\Delta T_j) = (R_3/R_4) \cdot (1/R_E) \cdot \Delta V_{BE} \tag{4}$$

It can be seen from the equation (3) that the use of the power source circuit 14 shown in FIG. 2 eliminates the dependency of the output signals $V_{OUT1}$ and $V_{OUT2}$ on the power supply voltage $V_{EE}$ as shown in FIG. 4. However, the desired compensation for the junction temperature $T_j$ is not still sufficient as will be seen from the equation (4). Suppose, for example, that $V_{CC} = 0$ V, $V_{EE} = -2$ V, the amplitude is 0.4 V, the voltage applied across the resistor $R_E$ is 0.4 V, and $V_{BE} = 0.8$ V. Then, $V_{CS} = ((R_3/R_4) + 1)V_{BE} = 0.4$ V $+ V_{BE} = 1.2$ V, and in this case, $(R_3/R_4)$ is selected to be $(R_3/R_4) = 0.5$. Therefore, the equation (4) is expressed as follows:

$$(\Delta I_{CS}/\Delta T_j) = 0.5/R_E \cdot \Delta V_{BE} \tag{4'}$$

Since the collector resistors $R_{CN}$ and $R_{CO}$ in FIG. 1 are selected to be $R_{CN} \approx R_{CO} \approx R_E$, the rate of variation of the low-level output $V_{OL}$ relative to the variation of the junction temperature $T_j$ is given by the following equation (5):

$$\frac{\Delta V_{OL}}{\Delta T_j} = \frac{\Delta I_{CS}}{\Delta T_j} \times R_{CO} \text{ or } R_{CN} \tag{5}$$

$$= 0.5 \Delta V_{BE}$$

The rate of variation given by the equation (5) is considerably large. The value of $\Delta V_{OL}$ will amount to $\Delta V_{OL} = 100$ mV when, for example, $\Delta V_{BE}/\Delta T_j = -2$ mV/°C. at a usual junction voltage, and $\Delta T_j = 50°$ C.

Figure 3:
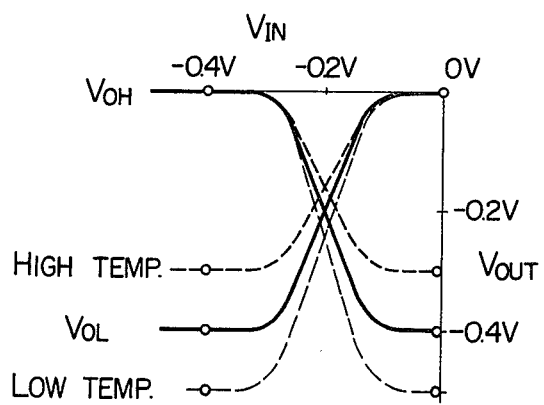

FIG. 5 shows the temperature dependency of such an output $V_{OUT}$. FIG. 3 shows the transmission characteristic of the CML circuit shown in FIG. 1 when the power source circuit 14 shown in FIG. 2 is used therewith.

It will thus be seen that the circuit 14 shown in FIG. 2 cannot fully compensate for the junction temperature dependency although it can satisfactorily compensate for the power supply voltage dependency. When the ratio of $R_3$ to $R_4$ in the equation (4) is selected to be sufficiently small, the rate of variation of $I_{CS}$ relative to $T_j$ can be made small, but the output level will not vary between the low level and the high level due to the increase in the ratio of $R_C$ to $R_E$ ($R_{CN}$ to $R_E$ or $R_{CO}$ to $R_E$). Further, this increase in the ratio of $R_C$ to $R_E$, hence, the increased gain in the current switch may result in undesirable oscillation of the circuit. Further, the circuit operation will be greatly affected by the manufacturing tolerances of these resistors.

The idea of compensating for both the temperature dependency and the power supply voltage dependency of an ECL circuit is described in the Muller at al article entitled "Fully-Compensated Emitter-Coupled Logic" in 1973 IEEE International Solid-State Circuits Conference DIGEST OF TECHNICAL PAPERS, p.p. 168-169.

FIG. 6 shows a preferred form of the bias generating circuit according to the present invention which provides an improvement in the prior art structure shown in FIG. 2. In FIG. 6, the circuit portion including the transistor $Q_4$ is generally similar to that shown in FIG. 2 except that the resistor $R_3$ in the bias circuit for the transistor $Q_4$, that is, the DC negative feedback circuit for the transistor $Q_3$, is divided into two resistors $R_{3A}$ and $R_{3B}$ connected in series. A multi-emitter transistor $Q_6$ is connected at its collector to the connection point of the two resistors $R_{3A}$ and $R_{3B}$ and at its emitters to the source of power supply voltage $V_{EE}$ through a common resistor $R_5$. The transistor $Q_6$ is connected at its base to the collector of the transistor $Q_4$ through a resistor $R_6$ and also to the source of power supply voltage $V_{EE}$ through a transistor $D_1$, which is connected to function as a diode and will therefore be referred to hereinafter as a diode. The resistor $R_6$ and the diode $D_1$ constitute a base bias circuit for the transistor $Q_6$.

In order that the bias generating circuit of the present invention shown in FIG. 6 can completely compensate for both the power supply voltage dependency and the junction temperature dependency of the CML circuit shown in FIG. 1 when combined with the CML circuit, the collector resistors $R_{CN}$, $R_{CO}$ and the emitter resistor $R_E$ are selected to have the same resistance value so as to supply a constant current to the transistor $Q_3$. That is, in regard to the current source voltage $V_{CS}$, the following equations must hold for the purpose of full compensation above described:

$$(\Delta V_{CS}/\Delta V_{EE}) = 0 \tag{6}$$

$$(\Delta V_{CS}/\Delta T_j) = \Delta V_{BE3}/\Delta T_j \tag{7}$$

where $V_{BE3}$ is the base-emitter voltage of the transistor $Q_3$.

The operation of the improved power source circuit according to the present invention will now be described in detail. The current flowing through the diode $D_1$, that supplied to the collector of the multi-emitter transistor $Q_6$, and that flowing through the resistor $R_4$ are designated by $I_1$, $I_2$ and $I_3$ respectively. Further, for the sake of simplicity, the base current of each individual transistor is disregarded as it is negligible.

The base-emitter voltage of the multi-emitter transistor $Q_6$, the forward voltage of the diode $D_1$ and the base-emitter voltage of the transistor $Q_4$ are designated by $V_{BE6}$, $V_{BE1}$ and $V_{BE4}$ respectively. Then, the following equations (8), (9) and (10) hold:

$$I_3 = V_{BE4}/R_4 \qquad (8)$$

$$I_2 = V_{BE1} - V_{BE6}/R_5 \qquad (9)$$

$$V_{CS} = R_{3A} I_2 + (R_{3A} + R_{3B}) I_3 + V_{BE4} \qquad (10)$$

Introducing the values of $I_3$ and $I_2$ given by the equations (8) and (9) into the equation (10), $V_{CS}$ is expressed as follows:

$$V_{CS} = \frac{R_{3A}}{R_5}(V_{BE1} - V_{BE6}) + \frac{R_{3A} + R_{3B} + R_4}{R_4} V_{BE4} \qquad (11)$$

$$= \frac{R_{3A}}{R_5} \cdot \frac{KT}{q} l_n J_1/J_2 + \frac{R_{3A} + R_{3B} + R_4}{R_4} V_{BE4}$$

where
K: Boltzman constant
q: charge of electron
T: absolute temperature
$J_1$: emitter current density in diode $D_1$
$J_2$: emitter current density in transistor $Q_6$ It will be apparent from the equation (11) that the equation (6) representing the dependency $(\Delta V_{CS}/\Delta V_{EE})$ of the current source voltage $V_{CS}$ on the variation of the power supply voltage $V_{EE}$ is now satisfied. On the other hand, the temperature dependency $(\Delta V_{CS}/\Delta T_j)$ is given by the following equation (12):

$$\frac{\Delta V_{CS}}{\Delta T_j} = \frac{R_{3A}}{R_5} \cdot \frac{K}{q} l_n \frac{J_1}{J_2} + \frac{R_{3A} + R_{3B} + R_4}{R_4} \cdot \frac{\Delta V_{BE4}}{\Delta T_j} \qquad (12)$$

The emitter area of the diode $D_1$ and that of the transistor $Q_6$ are now designated by $A_{E1}$ and $A_{E2}$ respectively. Then, $J_1/J_2$ is expressed as follows:

$$J_1/J_2 = \frac{I_1/A_{E1}}{I_2/A_{E2}} = \frac{I_1}{I_2} \cdot \frac{A_{E2}}{A_{E1}}$$

When the ratio $A_{E2}/A_{E1} = n$, the equation (12) is expressed as follows:

$$\frac{\Delta V_{CS}}{\Delta T_j} = \frac{R_{3A}}{R_5} \cdot \frac{K}{q} l_n\left(\frac{I_1}{I_2} \cdot n\right) + \frac{R_{3A} + R_{3B} + R_4}{R_4} \cdot \frac{\Delta V_{BE4}}{\Delta T_j} \qquad (13)$$

Therefore, the junction temperature dependency of the CML circuit can be fully compensated when the resistance values of the resistors $R_{3A}$, $R_{3B}$, $R_4$, $R_5$, the values of the currents $I_1$, $I_2$ and the value of the ratio $A_{E2}/A_{E1} = n$ are so selected that the value of $(\Delta V_{CS}/\Delta T_j)$ defined by the equation (13) is equal to the value of $(\Delta V_{BE3}/\Delta T_j)$ defined by the equation (7).

The transistor $Q_6$ may not be a multi-emitter transistor as illustrated, and the emitter area of the transistor $D_1$ acting as the diode $D_1$ may be different from that of the transistor $Q_6$ so as to compensate for the temperature variation of the transistor $Q_3$ in a manner similar to that described hereinbefore.

Figure 7:
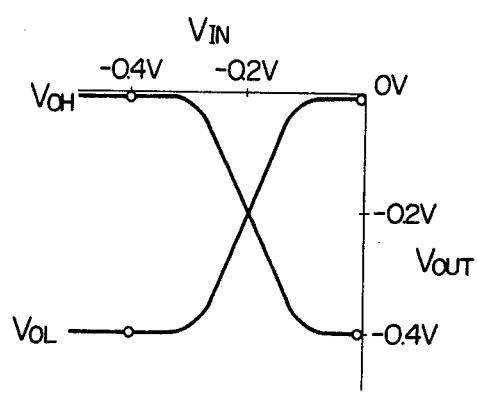
FIGS. 7, 8 and 9 show the transmission characteristic, the power supply voltage dependency characteristic and the junction temperature dependency characteristic respectively of the CML circuit shown in FIG. 1 when the improved bias generating circuit of the present invention shown in FIG. 6 is employed.
Figure 8:
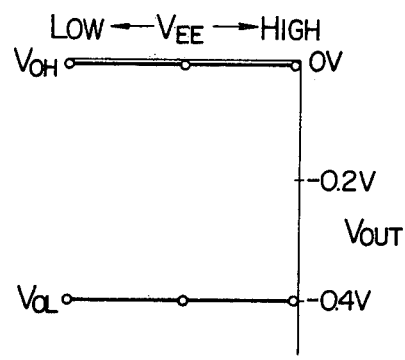
Figure 9:
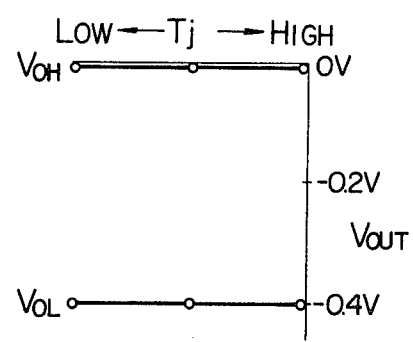

FIGS. 7, 8 and 9 show the transmission characteristic, the bias generating voltage dependency characteristic and the junction temperature dependency characteristic of the low-amplitude CML circuit shown in FIG. 1 when the improved power source circuit of the present invention shown in FIG. 6 is employed.

It will be understood from the foregoing detailed description of the present invention that the negative feedback is applied to the transistor $Q_3$ through its base bias circuit or shunt regulation circuit to compensate for the dependency of the transistor $Q_3$ on the power supply voltage $V_{EE}$, and the difference between the temperature dependency of the junction voltage of the multi-emitter transistor $Q_6$ and that of the diode $D_1$ due to the different emitter current densities is utilized to compensate for the temperature dependency of the transistor $Q_3$. It will thus be appreciated that both the power supply voltage dependency and the temperature dependency of the low-amplitude CML circuit can be fully compensated when the improved power supply circuit of the present invention is employed to provide the base bias for the constant-current transistor $Q_3$ in the CML circuit.

We claim:

1. A logic circuit comprising current mode logic circuit means including at least an input terminal applied with an input signal, an output terminal delivering an output signal, and a transistor functioning as a source of a constant current, and comprising bias means connected to the base of said constant-current source transistor, wherein said bias means includes a shunt regulation circuit supplying a base bias voltage maintained constant regardless of a variation in a power supply voltage, and a control circuit for controlling said shunt regulation circuit in dependence on a variation in the junction temperature to vary said base bias voltage, and wherein said shunt regulation circuit has a first transistor connected between sources of different potentials to apply its collector-emitter voltage to the base of said constant-current source transistor, and first bias means for dividing the collector-emitter voltage of said first transistor to provide the base bias voltage for said first transistor.

2. A logic circuit as claimed in claim 1, wherein said control circuit has a second transistor connected to said first bias means to shunt a portion of the current flowing through said first bias means, and second bias means for providing the base bias voltage for said second transistor, said second bias means including a third transistor functioning as a diode, said second transistor and said third transistor operating at different emitter current densities.

3. A logic circuit as claimed in claim 2, wherein said second transistor and said third transistor operate at different current densities to compensate for the junction temperature dependency of said constant-current source transistor.

4. A logic circuit as claimed in claim 2 or 3, wherein said second transistor is of the multi-emitter type.

5. A logic circuit as claimed in claim 2 or 3, wherein said second transistor and said third transistor have different emitter areas.

6. A logic circuit comprising:

an input terminal to which an input signal is applied;

a first transistor connected at its base to said input terminal;

a second transistor to the base of which a reference voltage is applied;

means for connecting the collectors of said first and second transistors to a source of a constant potential;

an output terminal connected to the collector of at least one of said first and second transistors;

a third transistor connected at its collector in common to the emitters of said first and second transistors to function as a source of a constant current; and bias means connected to the base of said third transistor, said bias means including a shunt regulation circuit for supplying a base bias voltage maintained constant regardless of a variation in the power supply voltage, and a control circuit for controlling said shunt regulation circuit depending on a variation in the junction temperature to vary said base bias voltage, wherein said shunt regulation circuit has a fourth transistor connected between sources of different potentials to apply its collector-emitter voltage to the base of said third transistor, and first bias means for dividing the collector-emitter voltage of said fourth transistor to provide the base bias voltage for said fourth transistor.

7. A logic circuit comprising:

an input terminal to which an input signal is applied;

a first transistor connected at its base to said input terminal;

a second transistor to the base of which a reference voltage is applied;

means for connecting the collectors of said first and second transistors to a source of a constant potential;

an output terminal connected to the collector of at least one of said first and second transistors;

a third transistor connected at its collector in common to the emitters of said first and second transistors to function as a source of a constant current; and bias means connected to the base of said third transistor, said bias means including a shunt regulation circuit for supplying a base bias voltage maintained constant regardless of a variation in the power supply voltage, and a control circuit for controlling said shunt regulation circuit depending on a variation in the junction temperature to vary said base bias voltage, wherein said control circuit has a fifth transistor connected to said first bias means to shunt a portion of the current flowing through said first bias means, and second bias means for providing the base bias voltage for said fifth transistor, said second bias means including a sixth transistor functioning as a diode, said fifth transistor and said sixth transistor operating at different emitter current densities.

8. A logic circuit as claimed in claim 7, wherein said fifth transistor and said sixth transistor operate at different current densities to compensate for the temperature dependency of said third transistor.

9. A logic circuit as claimed in claim 7 or 8, wherein said fifth transistor is of the multi-emitter type.

10. A logic circuit as claimed in claim 7 or 8, wherein said fifth transistor and said sixth transistor have different emitter areas.

11. A logic circuit comprising:

an input terminal to which an input signal is applied;

a first transistor connected at its base to said input terminal;

a second transistor to the base of which a reference voltage is applied;

means for connecting the collectors of said first and second transistors to a source of a constant potential;

an output terminal connected to the collector of at least one of said first and second transistors;

a third transistor connected at its collector in common to the emitters of said first and second transistors to function as a source of a constant current;

a fourth transistor connected between sources of different potentials to apply its collector-emitter voltage to the base of said third transistor;

first bias means for dividing the collector-emitter voltage of said fourth transistor to provide the base bias voltage for said fourth transistor;

a fifth transistor connected to said first bias means to shunt a portion of the current flowing through said first bias means; and second bias means including a sixth transistor functioning as a diode for providing the base bias voltage for said fifthe transistor, said fifth transistor and said sixth transistor operating at different emitter current densities.

12. A logic circuit as claimed in claim 11, wherein said first bias means includes first and second resistors connected in series across the collector and the base of said fourth transistor, and a third resistor connected across the emitter and the base of said fourth transistor, said fifth transistor being connected at its collector to the connection point of said first resistor and said second resistor.

13. A logic circuit as claimed in claim 11, wherein said second bias means includes a fourth resistor connected across the collector of said fourth transistor and the base of said fifth transistor, and a sixth transistor connected across the base of said fifth transistor and the emitter of said fourth transistor.

14. A logic circuit as claimed in claim 11, 12 or 13, wherein said fifth transistor and said sixth transistor operate at different current densities to compensate for the junction temperature dependency of said third tranistor.

15. A logic circuit as claimed in claim 14, wherein said fifth transistor is of the multi-emitter type.

16. A logic circuit as claimed in claim 14, wherein said fifth transistor and said sixth transistor have different emitter areas.

* * * * *